US010122356B2

(12) United States Patent
Kunishi et al.

(10) Patent No.: US 10,122,356 B2
(45) Date of Patent: Nov. 6, 2018

(54) SEMICONDUCTOR SWITCH

(71) Applicant: KABUSHIKI KAISHA TOSHIBA, Minato-ku (JP)

(72) Inventors: Yugo Kunishi, Kanagawa (JP); Yasuhiko Kuriyama, Kanagawa (JP); Yoshio Itagaki, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/450,985

(22) Filed: Mar. 6, 2017

(65) Prior Publication Data
US 2018/0083609 A1    Mar. 22, 2018

(30) Foreign Application Priority Data
Sep. 20, 2016    (JP) .................. 2016-183319

(51) Int. Cl.
    *H01P 1/15*    (2006.01)
    *H03K 17/60*   (2006.01)
    (Continued)

(52) U.S. Cl.
    CPC ......... *H03K 17/005* (2013.01); *H01L 23/538* (2013.01); *H01L 27/0255* (2013.01); *H01L 27/1203* (2013.01); *H01L 29/4916* (2013.01); *H01L 29/78* (2013.01); *H01L 29/94* (2013.01); *H03F 3/195* (2013.01); *H03F 3/213* (2013.01); *H03H 7/38* (2013.01); *H03K 17/081* (2013.01); *H03F 2200/387* (2013.01); *H03F 2200/451* (2013.01); *H04B 1/40* (2013.01)

(58) Field of Classification Search
CPC .. H03K 17/005; H03K 17/081; H01L 23/538; H01L 27/0255; H01L 27/1203; H01L 29/4916; H01L 29/78; H01L 29/94; H03F 3/195; H03F 3/213; H03F 2200/387; H03F 2200/451; H03H 7/38; H04B 1/40
USPC ................................. 327/365–508
See application file for complete search history.

(56) References Cited

U.S. PATENT DOCUMENTS 5,350,957 A * 9/1994 Cooper .............. H03K 17/6871
                                                              327/379
5,973,381 A * 10/1999 Kudo .................. H01L 21/2253
                                                              257/296
(Continued)

FOREIGN PATENT DOCUMENTS

JP    2000-294786    10/2000
JP    2003-100893     4/2003
(Continued)

*Primary Examiner* — Brandon S Cole
(74) *Attorney, Agent, or Firm* — Oblon, McClelland, Maier & Neustadt, L.L.P.

(57) ABSTRACT

A semiconductor switch includes a plurality of first terminals, a second terminal commonly provided for the plurality of first terminals, a plurality of first MIS switches provided between the plurality of the first terminals and the second terminal, respectively, configured to pass-through or cut-off a high frequency signal between the plurality of the first terminals and the second terminal, and formed on a SOI substrate, and a capacitor formed on the SOI substrate, connected between the second terminal and the plurality of the first MIS switches, and provided for the plurality of the first terminals commonly.

20 Claims, 6 Drawing Sheets

(51) Int. Cl.
*H04B 1/46* (2006.01)
*H01P 1/10* (2006.01)
*H02H 9/04* (2006.01)
*H03K 17/687* (2006.01)
*H03K 17/00* (2006.01)
*H01L 27/12* (2006.01)
*H01L 29/94* (2006.01)
*H01L 27/02* (2006.01)
*H01L 29/78* (2006.01)
*H01L 23/538* (2006.01)
*H03F 3/213* (2006.01)
*H01L 29/49* (2006.01)
*H03F 3/195* (2006.01)
*H03H 7/38* (2006.01)
*H03K 17/081* (2006.01)
*H04B 1/40* (2015.01)

(56) References Cited

U.S. PATENT DOCUMENTS

| | | | |
|---|---|---|---|
| 5,990,580 A * | 11/1999 | Weigand | H03K 17/693 307/116 |
| 6,066,993 A * | 5/2000 | Yamamoto | H03F 1/223 333/103 |
| 6,975,271 B2 * | 12/2005 | Adachi | H01P 1/15 333/103 |
| 6,978,122 B2 | 12/2005 | Kawakyu et al. | |
| 7,613,442 B1 | 11/2009 | Kelly et al. | |
| 8,159,283 B2 * | 4/2012 | Sugiyama | H03K 17/693 327/430 |
| 8,258,851 B2 * | 9/2012 | Miyazawa | H03K 17/693 327/365 |
| 8,742,502 B2 * | 6/2014 | Brindle | H01L 29/78609 257/347 |
| 9,373,955 B2 * | 6/2016 | Chen | H01Q 1/50 |
| 9,685,949 B2 * | 6/2017 | Yamamoto | H03K 17/693 |
| 2007/0290744 A1 * | 12/2007 | Adachi | H03F 3/24 330/51 |
| 2011/0169550 A1 * | 7/2011 | Brindle | H01L 29/78609 327/434 |
| 2012/0262828 A1 * | 10/2012 | Muthukrishnan | H01L 27/0274 361/56 |
| 2013/0194158 A1 * | 8/2013 | Chen | H01Q 1/50 343/876 |
| 2014/0062577 A1 * | 3/2014 | Chih-Sheng | H03K 17/693 327/427 |
| 2014/0198417 A1 * | 7/2014 | Wang | H02H 9/045 361/56 |
| 2015/0349770 A1 * | 12/2015 | Bakalski | H04B 1/006 455/78 |
| 2016/0156178 A1 * | 6/2016 | Yamamoto | H03K 17/693 361/16 |
| 2016/0190231 A1 * | 6/2016 | Ishimaru | H01L 21/263 257/66 |
| 2017/0076855 A1 * | 3/2017 | Roberg | H01F 19/04 |
| 2017/0103976 A1 * | 4/2017 | Zampardi | H01L 27/0248 |

FOREIGN PATENT DOCUMENTS

| | | |
|---|---|---|
| JP | 2004-282727 | 10/2004 |
| JP | 2005-515657 | 5/2005 |
| JP | 2013-026982 | 2/2013 |

* cited by examiner

SEMICONDUCTOR SWITCH

CROSS-REFERENCE TO RELATED APPLICATIONS

This application is based upon and claims the benefit of priority from the prior Japanese Patent Application No. P2016-183319, filed Sep. 20, 2016, the entire contents of which are incorporated herein by reference.

FIELD

Embodiments described herein relate generally to a semiconductor switch, especially a high frequency RF semiconductor switch.

BACKGROUND

In recent years, mobile communication equipment such as a mobile phone utilize a multi-band transmission/reception system, in which a plurality of high frequency signals need to be simultaneously transmitted and received by using a carrier aggregation type technique and a MIMO (Multiple-Input and Multiple-Output) type technique. As a result, a high frequency switch circuit used in the mobile communication equipment that is complicated and that increases the circuit area is utilized to switch the plurality of high frequency signals simultaneously. Such a high frequency switch circuit is also expected to have high withstand voltage for ESD (Electrostatic Discharge).

BRIEF DESCRIPTION OF THE DRAWINGS

A more complete appreciation of embodiments and many of the attendant advantages thereof will be readily obtained as the same becomes better understood by reference to the following detailed description when considered in connection with the accompanying drawings, wherein.

DETAILED DESCRIPTION

Various objects, features and attendant advantages of the exemplary embodiments described herein will be more fully appreciated from the following detailed description when considered in connection with the accompanying drawings in which like reference characters designate like or corresponding parts throughout the several views.

First Embodiment

Figure 1:
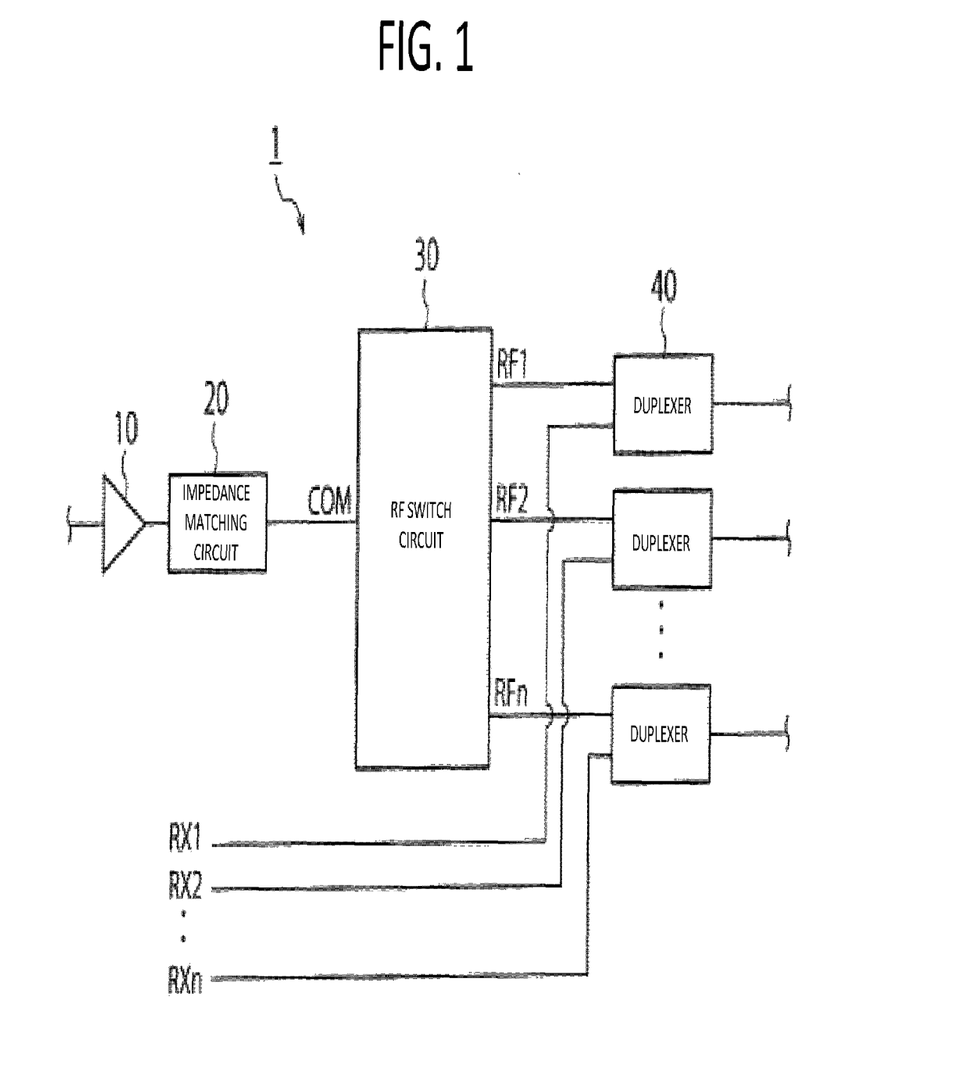
FIG. 1 is a block diagram of a high frequency transmitting and receiving circuit 1 according to a first embodiment.

FIG. 1 shows a block diagram of a high frequency transmitting and receiving circuit 1 according to a first embodiment. The high frequency transmitting and receiving circuit 1 can be used as an electronic equipment transmitting and receiving a high frequency signal, and can be applied, for example, to a mobile communication equipment, a wireless base station, or a wireless access point, e.g. a mobile phone, a smartphone, a wireless tablet computer, a wireless router. The high frequency transmitting and receiving circuit 1 can be formed by one-chip or a multi-chip module. For example, the high frequency transmitting and receiving circuit 1 is formed on an SOI (Silicon On Insulator) substrate and in one-chip. Also, a part of the high frequency transmitting and receiving circuit 1 might be formed in one-chip. For example, a power amplifier (PA) 10 and an RF switch circuit 30 can be formed in one-chip.

The high frequency transmitting and receiving circuit 1 includes a power amplifier (PA) 10, an impedance matching circuit 20, an RF switch circuit 30, and duplexers 40.

The PA 10 inputs a transmitting signal of a high frequency signal from a base-band circuit and a transceiver circuit (not shown), amplifies the transmitting signal by a specific gain, and outputs the transmitting signal to the impedance matching circuit 20.

The impedance matching circuit 20 is connected between the PA 10 and the RF switch circuit 30. For example, the impedance matching circuit 20 is an LC circuit. The impedance matching circuit 20 can match an impedance of the high frequency transmitting and receiving circuit 1 to a specific impedance, e.g. 50 ohm. Furthermore, the impedance matching circuit 20 can be formed on the same semiconductor chip as the PA 10 and the RF switch circuit 30, or can be formed as an external element.

The RF switch circuit 30 is provided between the impedance matching circuit 20 and the plurality of duplexers 40. The RF switch circuit 30 connects a common port COM as a second terminal to a plurality of output ports RF1-RFn as a plurality of first terminals. That is, the RF switch circuit 30 is an SPnT (Single-Pole n-Throw) switch circuit. The RF switch circuit 30 can switch (pass-through/cut-off) the high frequency signal between the common port COM and the plurality of output ports RF1-RFn.

The duplexers 40 filter and pass a transmitting signal having a specific frequency range from the RF switch circuit 30. The transmitting signal passing through any of the duplexers 40 is then transmitted through a switch and an antenna (not shown). The duplexers 40 filter and pass a receiving signal having a specific frequency range from the antenna and the switch (not shown) to the output ports RF1-RFn. The receiving signal passing any of duplexers 40 is amplified by an amplifier (e.g. PA10), and is then provided to a baseband circuit and a transceiver circuit.

Figure 2:
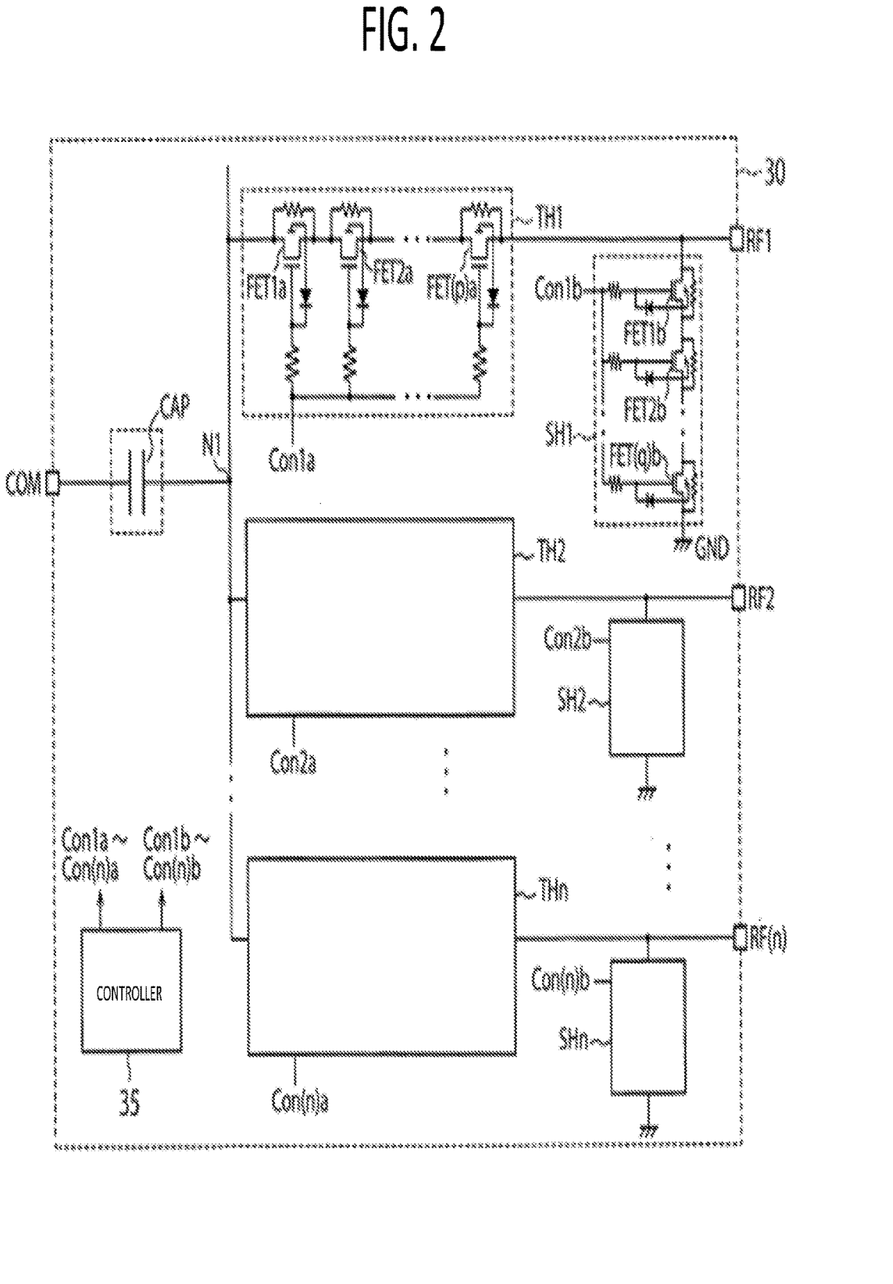
FIG. 2 is a circuit diagram of a RF switch circuit 30.

FIG. 2 shows a circuit diagram of RF switch circuit 30. The RF switch circuit 30 is formed on an SOI substrate as one semiconductor chip. Furthermore, the RF switch circuit 30 can be formed on one semiconductor chip including other semiconductor elements. The SOI substrate includes a substrate, an insulating film formed on the substrate, and a semiconductor layer formed on the insulating film. For example, the substrate is a silicon substrate. The insulating film is a silicon oxide film. The semiconductor layer is a silicon layer.

The RF switch circuit 30 includes output ports RF1-RFn (n is an integer greater than or equal to 2), a common port COM, a plurality of through switches TH1-THn, a plurality of shunt switches SH1-SHn, a capacitor CAP, and a controller 35 (processing circuitry such as a CPU). When the RF switch circuit 30 is formed in one semiconductor chip, the plurality of through switches TH1-THn, the plurality of shunt switches SH1-SHn, the capacitor CAP, and the controller 35 are formed on the semiconductor layer, e.g. a silicon layer.

The common port COM is provided for the plurality of output ports RF1-RFn commonly. Therefore, a transmitting signal from the common port COM is output from any of output ports RF1-RFn.

The through switches TH1-THn as first switches are connected between the output ports RF1-RFn and the common node N1, respectively. The through switches TH1-THn all have the same internal structure. Therefore, the internal structure of the through switch TH1 is explained, and the explanation of other through switches TH2-THn is omitted. The internal structure of through switch TH1 is shown in FIG. 2, and the internal structures of other through switches TH2-THn is omitted in FIG. 2.

The through switch TH1 includes a plurality of MISFETs (Metal Insulator Semiconductor Field Effect Transistors) FET1a-FET(p)a, p is an integer greater than or equal to 1. Gate electrodes of FET1a-FET(p)a are coupled to the controller 35, and receive as an input a control signal Con1a from controller 35. FET1a-FET(p)a come to the same status (On or Off state) simultaneously by the control signal Con1a. Then, the through switch TH1 functions as one switch. Similarly, other through switches TH2-THn function as one switch receptively according to each of control signals Con2a-Con(n)a. (Brackets of (p) and (n) are used for descriptive purposes to show that p and n are each an integer).

The through switches TH1-THn pass-through or cut-off the transmitting signal from the common port COM to each of the corresponding output ports RF1-RFn through the common node N1. When the through switch THk (1≤k≤n) of the through switches TH1-THn comes to an On state (conductive state), the other through switches TH1-THk−1, THk+1-THn come to an Off state (non-conductive state). Thereby, the through switch THk configures to pass-through the transmitting signal from the common port COM to the selected output port RFk of the output ports RF1-RFn.

The shunt switches SH1-SHn as second switches are connected between each of output ports RF1-RFn and a ground terminal GND as a reference voltage source. The shunt switches SH1-SHn all have a same internal structure. Therefore, the internal structure of the shut switch SH1 is explained and the explanation of other shunt switches SH2-SHn is omitted. FIG. 2 shows the internal structure of the shunt switch SH1. The internal structure of other shunt switches SH2-SHn is omitted in FIG. 2.

The shunt switch SH1 includes a plurality of MISFETs FET1b-FET(q)b connected in series between the output port RF1 and the ground terminal GND, q is an integer greater than or equal to 1. Gate electrodes of MISFETs FET1b-FET(q)b are connected to the controller 35 and receive as an input a same control signal Con1b. Thereby, MISFET FET1b-FET(q)b come to the same status (On or Off state) simultaneously. The shunt switch SH1 functions as one switch. Other shunt switches SH2-SHn also function as one switch respectively according to each of control signals Con2b-Con(n)b.

The control signals Con1b-Con(n)b are complementary signals for the control signals Con1a-Con(n)a, respectively. Therefore, when the through switch THk comes to an On state, the corresponding shunt switch SHk comes to an Off state. Also, when the through switch THk comes to an Off state, the corresponding shunt switch SHk comes to an On state.

The shunt switches SH1-SHn come to an On state when each of the through switches TH1-THn come to an Off state. Isolation characteristics between the common port COM and the output port RF1-RFn can thereby be improved. For example, when the through switch THk comes to an On state, the other through switches TH1-THk−1, THk+1-THn come to an Off state. Then, the shunt switch SHk corresponding to the through switch THk comes to an Off state, and the other shunt switches SH1-SHk−1, SHk+1-SHn come to an ON state. The through switch THk coming to an On state can thereby sufficiently lower an impedance between the common port COM and the output ports RFk. The shunt switch SHk corresponding to the through switch THk comes to an Off state, and can thereby sufficiently increase an impedance between the ground terminal GND and the output port RFk. Therefore, the shunt switch SHk can pass-through a high frequency signal between the common port COM and the output port RFk with low loss. When the shunt switches SH1-SHk−1, SHk+1-SHn come to an On state, a high frequency signal which seeks to pass or leak between the output ports RF1-RFk−1, RFk+1-RFn flows to the ground terminal GND. Thereby, isolation characteristics between the output ports RF1-RFk−1, RFk−1-RFn and the common port COM can be improved.

The capacitor CAP is connected between the common port COM and the common node N1. That is, the capacitor CAP is connected between the common port COM and the through switches TH1-THn and is commonly provided for the output ports RF1-RFn. The capacitor CAP can cut-off a DC current and a DC voltage. For example, an output signal of PA 10 might include DC power for driving an other PA 10 in addition to a high frequency signal. The capacitor CAP can remove the DC current from the high frequency signal. For example, the capacitor CAP can be a MIS capacitor or a polysilicon capacitor.

Here, a size of the capacitor CAP is preferably downsized to decrease an entire size of the high frequency transmitting and receiving circuit 1. To decrease the size of the capacitor CAP, the capacitor CAP can be provided in the same silicon layer as the through switches TH1-THn and the shunt switches SH1-SHn. That is, the capacitor CAP can be embedded in the semiconductor chip of RF switch circuit 30 with the through switches TH1-THn and the shunt switches SH1-SHn. For the capacitor CAP to be embedded in the RF switch circuit 30, it is preferable that the capacitor CAP is a MIS capacitor or a stacked capacitor.

Figure 3:
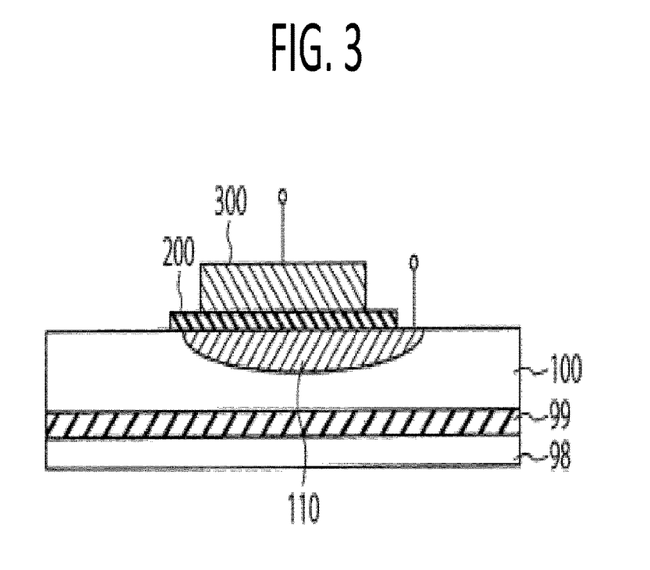
FIG. 3 is a cross-sectional view of a MIS capacitor.

FIG. 3 shows a cross-sectional view of a MIS capacitor as the CAP. The MIS capacitor can include a semiconductor layer 100, a gate insulating film 200, and a gate electrode 300. The gate insulating film 200 is formed on an impurity diffusion layer 110 formed in the semiconductor layer 100. The gate electrode 300 is formed on the gate insulating film 200. The impurity diffusion layer 110 and the gate electrode 300 function as electrodes of the capacitor CAP. Furthermore, the MIS capacitor is formed on the semiconductor layer 100 of an SOI substrate. The semiconductor layer 100 is formed on an insulating layer 99 of the SOI substrate. The insulating layer 99 is formed on a substrate 98.

Figure 4:
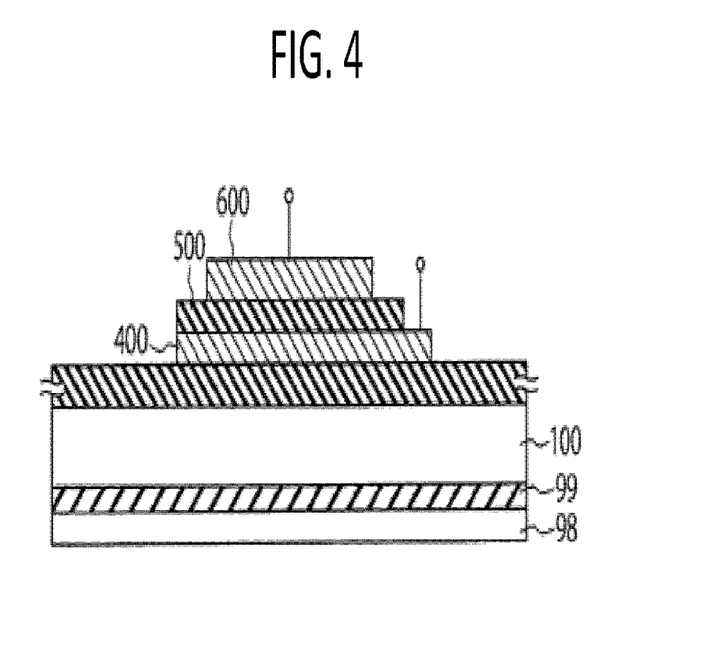
FIG. 4 is a cross-sectional view of a stacked capacitor.

FIG. 4 shows a cross-sectional view of a stacked capacitor as the CAP. The stacked capacitor can include a first polysilicon layer 400, an inter-layer insulating film 500, and a second polysilicon layer 600. The first polysilicon layer 400 is formed above the semiconductor layer 100. The inter-layer insulating film 500 is formed on the first polysilicon layer 400. The second polysilicon layer 600 is formed on the inter-layer insulating film 500. The first polysilicon layer 400 and the second polysilicon layer 600 function as electrodes of the capacitor CAP. Furthermore, the stacked capacitor is formed on the semiconductor layer 100 of an SOI substrate. The semiconductor layer 100 is formed on an insulating layer 99 of the SOI substrate. The insulating layer 99 is formed on a substrate 98.

If the capacitor CAP is embedded in the semiconductor chip of the RF switch circuit 30, the capacitor needs to be connected to the common port COM externally as an other external element. In that case, a number of components of the high frequency transmitting and receiving circuit 1 increases and the high frequency transmitting and receiving circuit 1 becomes larger.

In contrast, the RF switch circuit 30 of this embodiment embeds the capacitor CAP in the same semiconductor chip with the through switches TH1-THn and the shunt switches SH1-SHn. Thereby, the RF switch circuit 30 can cut-off a DC power from PA 10, and the RF switch circuit 30 and the high frequency transmitting and receiving circuit 1 can be downsized.

Second Embodiment

Figure 5:
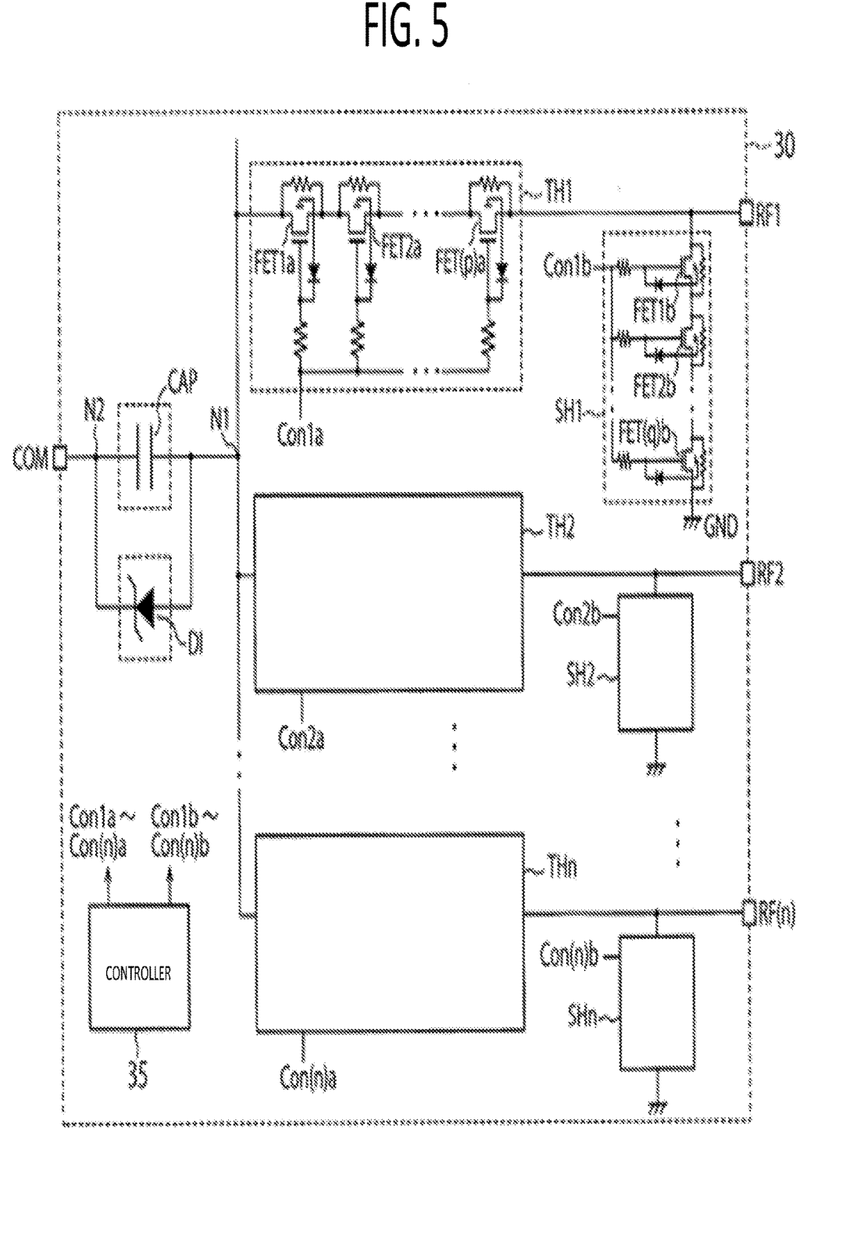
FIG. 5 is a circuit diagram of a RF switch circuit 30 according to a second embodiment.

FIG. 5 shows a circuit diagram of RF switch circuit 30 according to a second embodiment. The RF switch circuit 30 of the second embodiment is different from that of the first embodiment in a point of further including a diode DI. Other structures of the RF switch circuit 30 in the second embodiment are the same as that of the first embodiment.

The diode DI is connected in parallel to capacitor CAP. An anode of the diode DI is connected to a node N1 between the capacitor CAP and the plurality of through switches TH1-THn. A cathode of the diode DI is connected to a node N2 between the capacitor CAP and the common port COM. For example, the diode DI is a Zener diode, and generates a Zener breakdown by a specific reverse bias.

Here, to decrease a size of the entire high frequency transmitting and receiving circuit 1, a size of the capacitor CAP needs to be downsized. To downsize the capacitor CAP or increase the capacity, it is preferable to reduce thickness of a gate insulating film or an inter-layer insulating film between electrodes of the capacitor CAP. A thinner gate insulating film or inter-layer insulating film has a low withstand voltage for ESD (Electrostatic Discharge). Therefore, the capacitor CAP is more easily broken down since the capacitor CAP has a low withstand voltage for ESD by large capacity and by downsizing.

The RF switch circuit 30 of this embodiment includes the capacitor CAP and the diode DI connected in parallel to the capacitor CAP. The diode DI is connected in an opposite direction from the common port COM to the output ports RF1-RFn. Moreover, the breakdown voltage of the opposite direction of the diode DI is set to a higher voltage than a voltage applied to the common port COM normally (output voltage of PA 10). For example, when the output voltage of PA 10 is about 3.5V, the breakdown voltage of the opposite direction of the diode DI is set to about 5V. Thereby, even if the output voltage of PA 10 is applied in a normal operation, the diode DI is not broken down, and does not prevent the function of the capacitor CAP. Therefore, in the normal operation, the capacitor CAP can remove a DC power element from the common port COM. An ESD is normally at a higher voltage than 5V. When the ESD is applied to the common port COM, the diode DI is broken down (Zener breakdown). Thereby, the diode DI comes to a conductive state temporarily. A voltage difference between the common port COM and the node N1 then decreases. When the diode is broken down, the current flows to the ground terminal GND through the diode DI, the through switches TH1-THn, and the shunt switches SH1-SHn. As a result, the diode can prevent the capacitor CAP from being broken down.

The ESD might be applied to the common port COM and the output ports RF1-RFn when the RF switch 30 is implemented. Since the shunt switches SH1-SHn and the through switches TH1-THn are provided in a side of the output port RF1-RFn (and a further protection circuit could also be provided), the ESD is not directly applied to the capacitor CAP from the side of the output port RF1-RFn. However, the ESD might be directly applied to the capacitor CAP from a side of the common port COM. Therefore, the diode DI is connected in an opposite direction from the common port COM to the output ports RF1-RFn. Thereby, when the ESD is applied to the common port COM, the diode DI is broken down and can prevent the capacitor from being broken down.

As noted above, the RF switch circuit 30 of the second embodiment includes the diode DI connected in parallel to the capacitor CAP. Thereby, even if an insulating film between electrodes of the capacitor CAP is thinner to increase a capacitance of the capacitor CAP and downsize the capacitor CAP, the diode DI can prevent a withstanding voltage of the ESD of the capacitor CAP from decreasing. That is, the RF switch circuit 30 of the second embodiment can be downsized and have a high withstanding voltage of the ESD.

The RF switch circuit 30 can still be provided with the capacitor CAP, the through switches TH1-THn, and the shunt switches SH1-SHn on an SOI substrate of a same semiconductor chip.

In the case that the RF switch circuit 30 is provided on a bulk silicon substrate, an ESD can flow to the substrate. But in that case that the RF switch circuit 30 is provided on a semiconductor layer of the SOI substrate, the ESD cannot flow to the substrate because the SOI substrate has an insulating film between the substrate and the semiconductor layer.

In the second embodiment, the diode DI is connected in parallel to the capacitor CAP. Thereby, even if the RF switch circuit 30 is provided on the semiconductor layer of the SOI substrate, the capacitor CAP can be protected from the ESD because the diode DI can allow the ESD to flow easily.

Moreover, since the diode DI is connected in parallel to the capacitor CAP, a voltage difference between both ends of the diode DI is decreased. Therefore, a distortion of a high frequency signal generated in the diode DI can be suppressed and the withstanding voltage of the diode DI can be decreased. For example, when the diode DI is connected between the node N2 and the ground terminal GND, the diode DI needs a withstanding voltage of a peak voltage of a high frequency signal (i.e. about 32 V). On the other hand, when the diode DI is connected in parallel to the capacitor CAP, the diode DI needs a withstanding voltage of a DC voltage applied to the common port COM (i.e. about 5 V).

Third Embodiment

Figure 6:
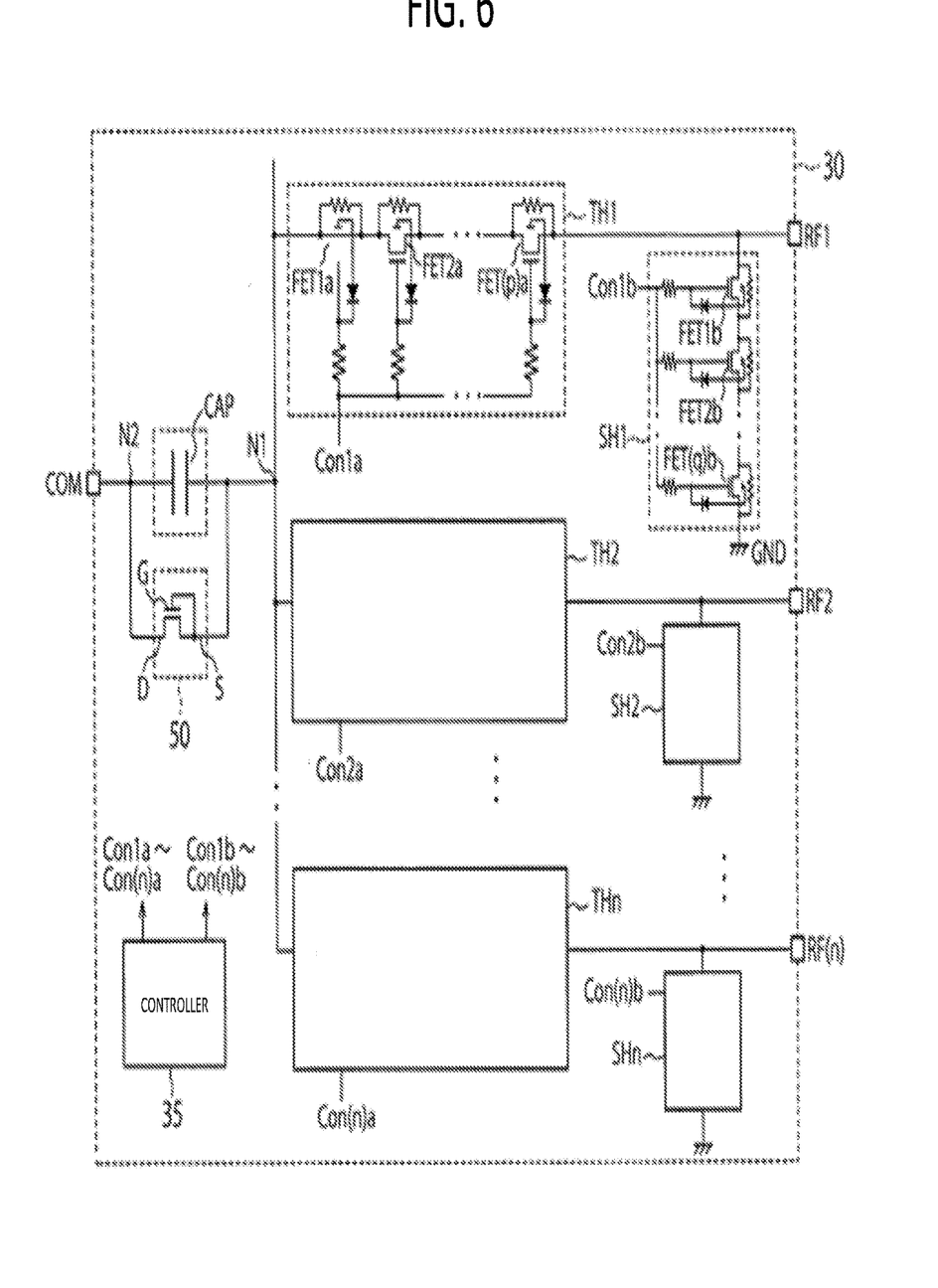
FIG. 6 is a circuit diagram of a RF switch circuit 30 according to a third embodiment.

FIG. 6 shows a circuit diagram of RF switch circuit 30 according to a third embodiment. The RF switch circuit 30 of the third embodiment includes a MISFET 50 as a diode. Other components of the RF switch circuit 30 can be the same as those of the first embodiment.

A source S of the MISFET 50 is connected to a node N1 between a capacitor CAP and a plurality of through switches TH1-THn. A drain D of the MISFET 50 is connected to a node N2 between the capacitor CAP and a common port COM. A gate electrode G and the source S of the MISFET 50 are connected and shorted to each other. Thereby, the MISFET 50 becomes an equivalent circuit of the diode DI. Moreover, the MISFET 50 is provided on the same semiconductor layer as FETs of controller 35 and/or the through switches TH1-THn. For example, the MISFET 50 can be formed by the same manufacturing process as FETs of the controller 35.

A breakdown voltage in the opposite direction of the MISFET 50 is set to a higher voltage than a voltage normally applied to the common port COM (Output voltage of PA 10), similarly to the diode DI. Thereby, in a normal operation, the MISFET 50 is not broken down and does not prevent a function of the capacitor CAP. Therefore, in the normal operation, a DC power element from the common port COM can be removed.

On the other hand, when an ESD exceeding a breakdown voltage is applied to the common port COM, the MISFET 50 is broken down (Zener breakdown). Thereby, the MISFET 50 comes to a conductive state temporarily, and a voltage difference between the common port COM and the node N1 falls to a lower level. When the MISFET 50 is broken down, the current flows to the ground terminal GND through the MISFET 50, the through switches TH1-THn, and the shunt switches SH1-SHn. As the result, the MISFET 50 can prevent the capacitor CAP from being broken down.

Figure 7:
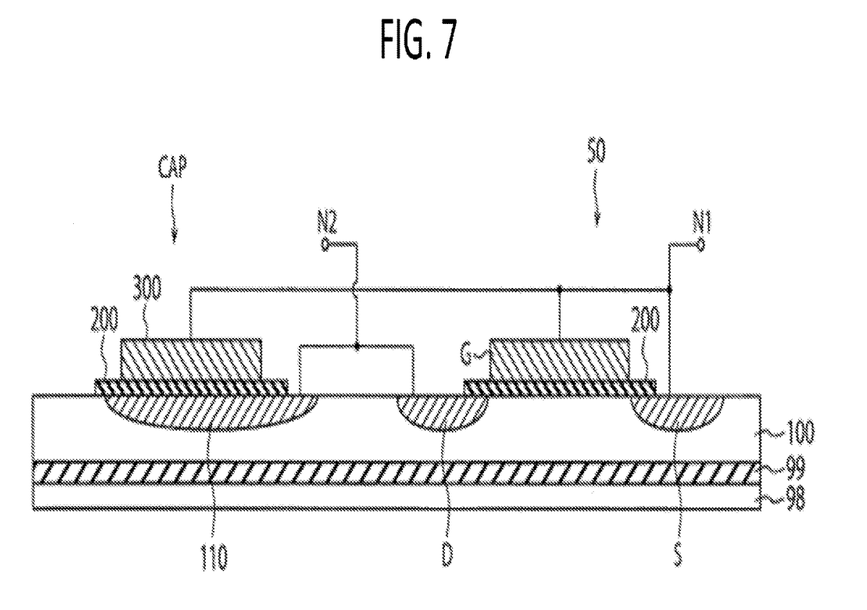
FIG. 7 is a cross-sectional view of a capacitor CAP and MISFET 50.

FIG. 7 shows a cross-sectional view of capacitor CAP and MISFET 50. The capacitor CAP and the MISFET 50 are provided on the same semiconductor layer 100. The capacitor CAP is the same as the MIS capacitor shown in FIG. 3. Moreover, the capacitor CAP and the MISFET 50 are provided on the semiconductor layer 100 of SOI substrate. The semiconductor layer 100 is formed on the insulating layer 99. The insulating layer 99 is formed on the substrate 99.

The MISFET 50 includes a source layer S, a drain layer D, a gate insulating film 200, and a gate electrode G. The source layer S and the drain layer D are formed in the semiconductor layer 100. The gate insulating film 200 is formed on the semiconductor layer 100 and between the source layer S and the drain layer D. The gate electrode G is formed on the gate insulating film 200.

The gate electrode is electrically connected to one electrode 300 of the capacitor 300, the source layer S, and the node N1. The drain layer D is electrically connected to the impurity diffusion layer 110 and the node N2. The capacitor CAP and the MISFET 50 are provided on the same semiconductor layer 100. Furthermore, other through switches TH1-THn, shunt switches SH1-SHn, and controller 35 are also provided on the same semiconductor layer 100. Thereby, the RF switch circuit 30 and the high frequency transmitting and receiving circuit 1 can be downsized.

While certain embodiments have been described, these embodiments have been presented by way of example only, and are not intended to limit the scope of the embodiments. Indeed, the novel embodiments described herein may be embodied in a variety of other forms; furthermore, various omissions, substitutions and changes in the form of the embodiments described herein may be made without departing from the spirit of the embodiments. The accompanying claims and their equivalents are intended to cover such forms or modifications as would fall within the scope and spirit of the embodiments.

The invention claimed is:

1. A semiconductor switch comprising:
    a plurality of first terminals;
    a second terminal commonly provided for the plurality of first terminals;
    a plurality of first MIS switches provided between the plurality of the first terminals and the second terminal, respectively, configured to pass-through or cut-off a high frequency signal between the plurality of the first terminals and the second terminal, and formed on a SOI substrate, and including MIS switches directly connected to the plurality of first terminals and ground; and
    a capacitor formed on the SOI substrate, connected between the second terminal and the plurality of the first MIS switches, and provided for the plurality of the first terminals commonly.

2. The semiconductor switch according to claim 1, further comprising:
    a plurality of second MIS switches formed on the SOI substrate, and connected between the plurality of first terminals and a reference voltage source, respectively.

3. The semiconductor switch according to claim 2, further comprising:
    a diode connected in parallel to the capacitor, and formed on the SOI substrate.

4. The semiconductor switch according to claim 3,
    wherein an anode of the diode is connected to a node between the capacitor and the plurality of first MIS switches,
    wherein a cathode of the diode is connected to a node between the capacitor and the second terminal.

5. The semiconductor switch according to claim 4, further comprising:
    an amplifier connected to the second terminal;
    wherein a withstand voltage between the cathode and the anode is higher than an output voltage of the amplifier connected to the second terminal.

6. The semiconductor switch according to claim 5,
    wherein the plurality of the first switches, the capacitor, and the diode are formed on the SOI substrate.

7. The semiconductor switch according to claim 4, further comprising:
    an amplifier connected to the second terminal;
    wherein a withstand voltage between the cathode and the anode is higher than an output voltage of the amplifier connected to the second terminal.

8. The semiconductor switch according to claim 3,
    wherein the diode is a MISFET (Metal Isolation Semiconductor Field Effect Transistor) including a gate, a source, and a drain, the gate is connected to the source, the source is connected to a node between the capacitor and the plurality of the first switches, and the drain is connected to a node between the capacitor and the second terminal.

9. The semiconductor switch according to claim 3,
    wherein the plurality of the first switches, the capacitor, and the diode are formed on the SOI substrate.

10. The semiconductor switch according to claim 1, further comprising:
    a diode connected in parallel to the capacitor, and formed on the SOI substrate.

11. The semiconductor switch according to claim 10,
    wherein an anode of the diode is connected to a node between the capacitor and the plurality of first MIS switches,
    wherein a cathode of the diode is connected to a node between the capacitor and the second terminal.

12. The semiconductor switch according to claim 11, further comprising:
    an amplifier connected to the second terminal;

wherein a withstand voltage between the cathode and the anode is higher than an output voltage of the amplifier connected to the second terminal.

13. The semiconductor switch according to claim 12, wherein the diode is a MISFET (Metal Isolation Semiconductor Field Effect Transistor) including a gate, a source, and a drain, the gate is connected to the source, the source is connected to a node between the capacitor and the plurality of the first switches, and the drain is connected to a node between the capacitor and the second terminal.

14. The semiconductor switch according to claim 12, wherein the plurality of the first switches, the capacitor, and the diode are formed on the SOI substrate.

15. The semiconductor switch according to claim 10, further comprising:
an amplifier connected to the second terminal;
wherein a withstand voltage between the cathode and the anode is higher than an output voltage of the amplifier connected to the second terminal.

16. The semiconductor switch according to claim 10, wherein the diode is a MISFET (Metal Isolation Semiconductor Field Effect Transistor) including a gate, a source, and a drain, the gate is connected to the source, the source is connected to a node between the capacitor and the plurality of the first switches, and the drain is connected to a node between the capacitor and the second terminal.

17. The semiconductor switch according to claim 10, wherein the plurality of the first switches, the capacitor, and the diode are formed on the SOI substrate.

18. The semiconductor switch according to claim 1, wherein the capacitor is a MIS capacitor.

19. The semiconductor switch according to claim 1, wherein the capacitor is a transistor formed on the SOI substrate,
wherein the transistor includes a gate insulating film, a gate electrode, and an impurity region formed under the gate insulating film and in the SOI substrate.

20. The semiconductor switch according to claim 1, wherein the capacitor includes a first polysilicon layer formed above the SOI substrate, an interlayer insulating film formed on the first polysilicon layer, and a second polysilicon layer formed on the interlayer insulating film.

* * * * *